United States Patent [19]

Tsurumi

[11] Patent Number: 4,897,794
[45] Date of Patent: Jan. 30, 1990

[54] IMPULSE COIL TESTER

[75] Inventor: Keiichi Tsurumi, Tokyo, Japan

[73] Assignee: Egg Co., Ltd., Tokyo, Japan

[21] Appl. No.: 76,386

[22] Filed: Jul. 21, 1987

[51] Int. Cl.⁴ ..................... G06F 11/32; G01R 31/00
[52] U.S. Cl. .................................... 364/482; 324/654;
364/481; 364/551.01; 364/580
[58] Field of Search ........... 364/550, 481, 482, 551.01,
364/580; 324/59; 371/25

[56] References Cited

U.S. PATENT DOCUMENTS

| | | | |
|---|---|---|---|
| 3,855,554 | 12/1974 | Müler et al. | 324/59 |
| 3,932,806 | 1/1976 | Kawada | 324/59 |
| 4,055,801 | 10/1977 | Rike et al. | 364/550 |
| 4,271,515 | 6/1981 | Axtell, III et al. | 371/25 |
| 4,314,234 | 2/1982 | Darrow et al. | 324/59 |
| 4,419,623 | 12/1983 | Ketchledge | 324/59 |
| 4,477,772 | 10/1984 | So | 324/59 |
| 4,528,498 | 7/1985 | So | 324/59 |
| 4,701,867 | 10/1987 | Brüggemann | 371/25 X |
| 4,799,220 | 1/1989 | Nielsen | 371/25 |

FOREIGN PATENT DOCUMENTS

| | | | |
|---|---|---|---|
| 2913895 | 10/1980 | Fed. Rep. of Germany | 364/550 |
| 2103459 | 2/1983 | United Kingdom | 364/550 |

Primary Examiner—Felix D. Gruber
Attorney, Agent, or Firm—McGlew & Tuttle

[57] ABSTRACT

The impulse coil tester of this invention comprises a high voltage current source in which an output voltage is stably controlled, an impulse current generating part, a terminal giving the impulse current to a measuring coil, a memory once memorizing the damped vibration current waveform data of the current flowing through the measuring coil, a memory having memorized in advance the damped vibration current waveform data of the current given to a master coil and a microcomputer comparatively operating said two data.

1 Claim, 3 Drawing Sheets

IMPULSE COIL TESTER

FIELD OF THE INVENTION

This invention relates to an impulse coil tester for measuring or testing by non-destruction the electric characteristics of a coil as wound, such as the coil of a transformer.

BACKGROUND OF THE INVENTION

In a conventional impulse coil tester, the same impulse voltage is simultaneously impressed on a reference master coil and on a coil under test and damped oscillation current waveforms flowing through the respective coils are comparatively observed on a cathode-ray tube to judge the quality of the coil under test.

FIG. 5 is a block connection diagram of such a conventional impulse coil tester. In the diagram, the reference numeral 1 represents a sweep circuit having a sweep oscillator, 2 represents a cathode-ray tube into whose horizontal deflecting plate are input saw tooth waves from the sweep oscillator and 3 represents a voltage regulator generating a high voltage to be input into a rectifier 4. A charging and discharging capacitor 5 is connected to this rectifier 4. A thyristor 8, functioning to input a high voltage with which the capacitor 5 is to be charged into voltage dividing capacitor 6 and 7 at a fixed timing, is connected to this capacitor 5. A trigger signal is input into the gate of this thyristor 8 at a fixed timing from a trigger circuit 9. The reference numerals 10 and 11 represent respectively a coil under test and a master coil which are connected to the thyristor through a relay switch 12. Reference numerals 13 and 14 represent current detecting resistances. The reference numeral 15 represents a comparator for comparing the damped oscillation current waveforms of the coil under test 10 and master coil 11 to judge the quality of the coil under test and 16 represents a sensitivity regulating resistor. An indicator such as a light emitting diode is connected to the comparator to judge and indicate the quality of the coil under text.

However, in such a conventional impulse coil tester, there have been problems that the master coil is always required to measure the characteristics of the coil under test 10 and a high voltage impulse is so often repeatedly impressed on the master coil so that the measuring error becomes large while the deterioration is not noticed. This results in a failure to correctly measure the characteristics of the coil under test. Additionally, as only the voltage and current flowing through both coils 10 and 11 are compared in measuring the quality with the comparator 15, the error appearing when the damping of the current flowing while oscillation has progressed and the oscillation amplitude has become small is hard to detect. That is to say, it has not been possible to judge the above-mentioned error by discriminating the frequency and amplitude size of the output waveform.

SUMMARY AND OBJECTS OF THE INVENTION

Therefore, an object of the present invention is to provide an impulse coil tester whereby the damped oscillation current waveform of a coil under test can be compared against the normally stably displayed reference wave form with high precision.

Another object of the present invention is to provide an impulse coil tester normally requiring no master coil to measure the characteristics of a coil under test.

Further, the other object of the present invention is to provide an impulse coil tester whereby the damped oscillation waveform of a reference master coil and coil under test can always be reproduced on a cathode-ray tube and both waveforms can be simultaneously displayed to investigate the characteristics of the coil under test with time.

In order to attain the above-mentioned objects, the formation of the present invention is characterized in that the damped oscillation waveform of the measuring coil is A/D (analog/digital) converted and is read to a memory location in a RAM (Random Access Memory) and the damped oscillation current waveform which is a memory output of this RAM and the damped oscillation waveform stored in advance in the RAM, which is backed up by a battery, are compared in an operation processing part such as a microcomputer (processor/controller).

The operation of the above-mentioned formation is as follows:

In the operation processing part (microcomputer) of the invention, the damped oscillation waveform generated in the master coil by impressing an impulse current in advance is signal-processed and is stored in the battery backup RAM. This stored damped oscillated waveform is always displayed on an indicator such as a cathode-ray tube (CRT) by the microcomputer, the damped oscillation waveform of the coil under test (which is one of a series of samples obtained during testing a large number of products in sequence) is stored in memory in another RAM and this damped oscillation waveform is also displayed in the above-mentioned indicator freely without limit in time such that both the quality of the coil under test may be judged while monitoring the errors of both waveforms and the differences in the frequency and amplitude between both wave forms may be judged by the operation processing part (microcomputer) and not only the difference in the inductance but also the interlayer insulation and the dielectric fatigue and dielectric strength may be measured and inspected.

The various features of novelty which characterize the invention are pointed out with particularity in the claims annexed to and forming a part of this disclosure. For a better understanding of the invention, its operating advantages and specific objects obtained by its uses, reference is made to the accompanying drawings and descriptive matter in which preferred embodiments of the invention are illustrated.

DESCRIPTION OF THE PREFERRED EMBODIMENT

An embodiment of the present invention shall be concretely explained in the following with reference to FIGS. 1 to 4.

Figure 1:
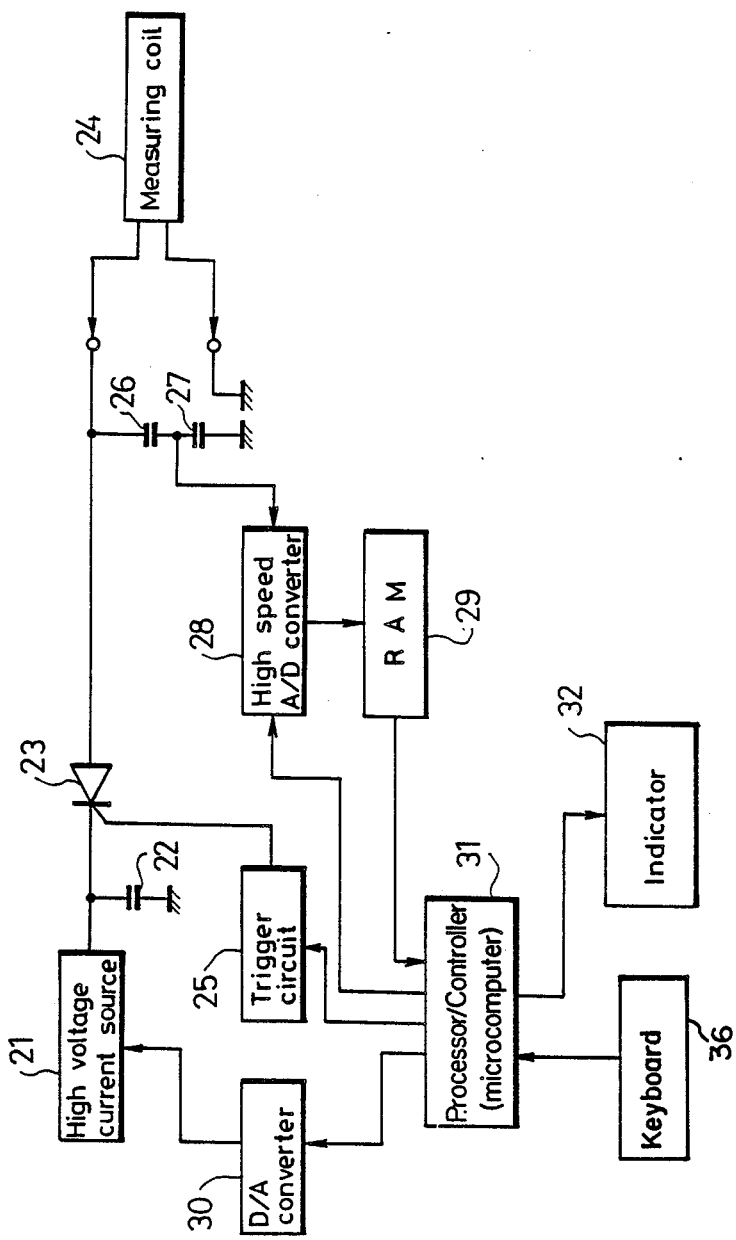
FIG. 1 is a block connection diagram of an impulse coil tester according to the present invention.

FIG. 1 is a block connection diagram of an impulse coil tester according to this invention. In the drawing, the reference numeral 21 represents such high voltage current source as a pulse impressing current source formed, for example as a direct current switching current source, 22 represents a capacitor connected to the high voltage current source to charge and discharge a high voltage, 23 represents a thyristor which is a switching element discharging the electric charge of the capacitor 22 by a switching operation and feeding it to a coil under test 24, 25 represents a trigger circuit outputting a trigger signal switching the thyristor 23, and 26 and 27 represent damped oscillation voltage dividing capacitors connected to the output side of the thyristor 23. A high speed processing A/D converter 28 is connected to the intermediate connecting point of these voltage dividing capacitors 26 and 27. A RAM 29a employed as a memory is connected to the output side of the A/D converter 28. A floppy disc or magnetic tape can be used for this RAM. Reference numeral 30 represents a D/A converter converting the digital signal for determining the output voltage of the high voltage current source 21 designated from a later described processor/controller (micrcomputer) 31 to an analogue signal and supplying to the above-mentioned high voltage current source.

The processor/controller (microcomputer) 31 controls not only the above-mentioned voltage determining function but also the operations of the A/D converter 28 and the trigger circuit and operates to compare the frequency and amplitude values of the output of the RAM 29a having memorized the damped oscillation waveform of the coil under test and the output of the battery backup RAM 29b internally fitted in this part so that whether or not the damped oscillation waveform output by the A/D converter 28 coincides with the reference damped oscillation waveform stored in the battery backup RAM 29b, or is within a fixed allowable range determined with this waveform as a reference, that is, within a set window range may be determined. The result of the determination may be indicated in the indicator 32. The above mentioned processor/controller 31 is provided with a central processing unit (CPU), making the above-mentioned comparison operations. An input-output interface and backup battery, as for the above mentioned RAM 29b, are set within an operating board together with the indicator 32.

The operation shall be described in the following.

Figure 2:
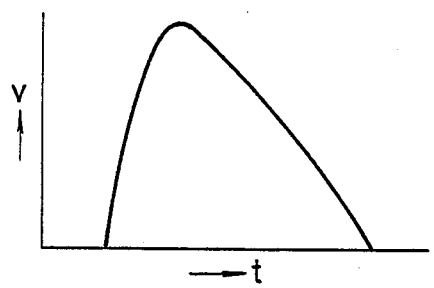
FIG. 2 is a wave form of an impulse voltage impressed on a coil under test.
Figure 3:
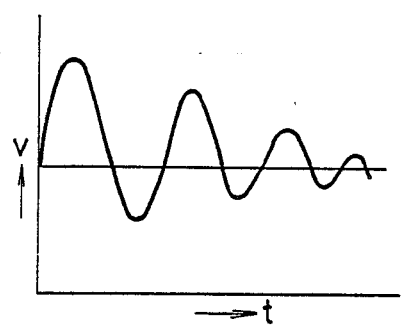
FIG. 3 is a free damped oscillation waveform diagram of a master coil.

First of all, with the key-in designating the test operation in a keyboard 36 or the like, the processor controller 32 inputs a voltage controlling signal. The voltage controlling signal is processed to be analog by the D/A converter and fed into the high voltage current source 21. Therefore, the capacitor 22 is charged with a controlled high voltage output from this high voltage current source 21. On the other hand, the processor controller 31 also operates the trigger circuit 25 to input a trigger current into the gate of the thyristor 23 at a predetermined timing. Therefore, the thyristor 23 turns on, thereby the capacitor 22 discharges the electric charge and such impulse voltage as is shown in FIG. 2 is impressed on the coil under test 24. By the impression of this impulse voltage, the damped oscillation signal shown in FIG. 3 is generated in the above mentioned coil under test 24. This signal is gradually damped while repeating the electrically intrinsic amplitudes and frequencies.

The voltage of the thus generated damped oscillation signal is divided by the voltage dividing capacitors 26 and 27, is then converted at a high speed by the A/D converter 28 and is once memorized in the RAM 29a.

On the other hand, the data of the damped oscillation wave form of the coil under test memorized in this RAM 29a are input into the central processing unit of the processor controller 31.

Figure 4:
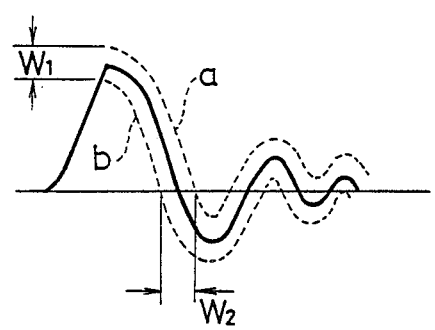
FIG. 4 is a window setting diagram set with the damped oscillation waveform of the master coil as a center; and, FIG. 5 is a block connection diagram of a conventional impulse coil tester.
Figure 5:
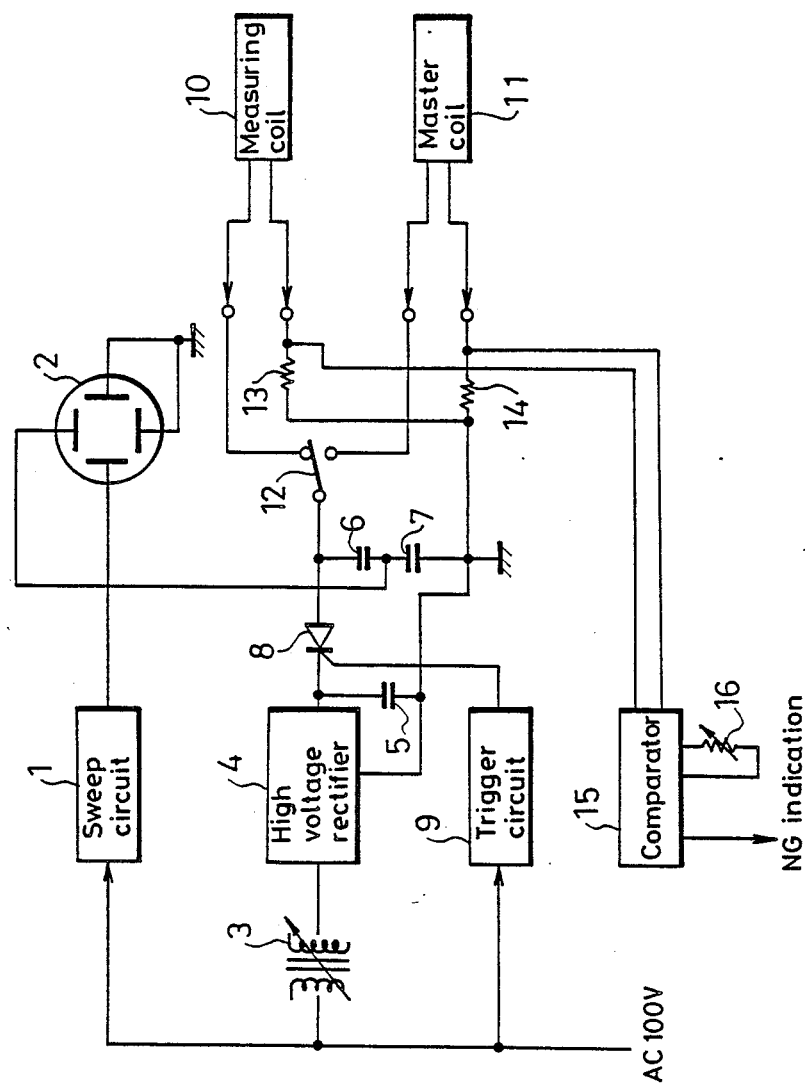

These data are operated on and compared with the data of the damped oscillation signal waveform of the master coil memorized in advance in the battery backup RAM 29b provided within the processor controller 31. Not only the differences in the amplitude and frequency value between the respective signals are determined but also both signal waveforms are displayed in the indicator 32. In this case, if such window patterns are as shown by a and b in FIG. 4 are simultaneously displayed with a fixed allowable difference (allowable width) with reference to the damped oscillation waveform of the master coil, whether the coil under test 24 is proper or not may be determined on the cathode-ray tube by whether or not the damped oscillation signal wave of the measuring coil 24 is within this window pattern range W1.

Not only is the memory of the damped oscillation signal of the above-mentioned master coil memorized in advance in the battery backed up RAM 29b within the operation controlling part 31 using the same method as for memorizing the damped oscillation signal waveform of the coil under test 24 in the RAM 29a, but also, such damped oscillation signal waveform can be stored after measurement on a magnetic tape or floppy disc. In such case, thirteen master data per RAM and 600 or more kinds of master data in the case of the floppy disc can be stored.

The processor/controller can be realized with only a logic circuit. A microcomputer of 8 bits is preferred as it has advantages of a small size and low cost. A microcomputer of 16 bits is more expensive and will shorten the time required for the waveforms to be depicted and compared.

When the frequency of the damped waveform of the master coil is received by the RAM 29b a count begins, the time at which the count reaches a predetermined value is determined, and two points are set at an appropriate, predetermined spacing before and after it, the part between these two points forming a window W2 of the frequency if the count value of the damped oscillation waveform of the measuring coil 24 is within such predetermined value, the measuring coil is judged to be good.

Though the comparison operation by the frequency may be made for one cycle, there is a limit to the minimum resolution of the measurement, and a judgement at a high precision is hard to make. In the judgement with N cycles, the difference of the time in one cycle is made N times, therefore, as a result, the resolution of the frequency judgement is made N times and the judgment of the quality of a minute variation of the inductance is effective. The N cycles can be determined from the number of zero crossing of the waveform. For this purpose, the number of times of the turning of the sign of the data memorized in the RAM may be investigated. No special hardware is required for this purpose.

Thus, in the impulse coil tester of the invention, by properly selecting and combining the amplitude and frequency window width (range), the inductance, Q (sharpness), interlayer insulation, core material and characteristics can be clearly measured and tested and positively confirmed.

A frequency of the oscillation waveform is determined by the inductance of a coil and also stray capacitance. The Q-factor (sharpness) indicates an energy loss of the coil and in waveform, is indicated by the degree of decay in amplitude. A failure of the interlayer insulation causes a corona discharge to be generated due to an impulse of a high voltage, resulting in that the waveform may generate noise.

According to the present invention, there are the following effects:

(A) As the damped oscillation waveform of the master coil is once memorized in the battery backed up RAM and this memorized damped oscillation waveform and the damped oscillation waveform of the coil under test are compared, no master coil is required at the time of the above-mentioned comparison.

(B) Therefore, such quality deterioration by the long time use of the master coil as in the past and the reduction of the reliability of the coil test result can be prevented.

(C) The damped oscillation waveforms of both of the master coil and coil under text are memorized in the RAM. These waveforms may be reproduced at any time on the cathode-ray tube and can be simultaneously displayed to investigate the characteristics of both coils with sufficient time.

(D) As the window width is set and indicated with reference to the amplitude and frequency value of the damped oscillation waveform as of the master coil, the quality of the measuring coil can be more easily judged.

While specific embodiments of the invention have been shown and described in detail to illustrate the application of the principles of the invention, it will be understood that the invention may be embodied otherwise without departing from such principles.

What is claimed is:

1. An impulse coil tester wherein an intrinsic damped oscillation current waveform produced in a measuring coil by impressing an impulse voltage thereon is compared with a damped oscillation current waveform of a reference master coil comprising:

terminal means for connection to successive individual measuring coils of a series of measuring coils;

means for generating a high voltage current source;

trigger circuit means for connecting said high voltage current source periodically to said terminal means and thereby to respective successive measuring coils;

first and second serially connected capacitive means connected across the terminals thereby to divide the damped oscillation voltage of an individual measuring coil;

a high-speed A/D converter having an input connected to a voltage dividing connecting point between the first and second capacitive means;

a first RAM connected to an output of the A/D converter;

a second memory means having a damped oscillation current waveform of a master coil permanently stored therein;

a CPU connected to the A/D converter, the trigger circuit and both memory means, the CPU being operable to actuate the trigger circuit repeatedly to feed an impulse voltage from the high voltage current source to the measuring coil, the A/D converter, and to read and compare respective successive damped oscillation current waveform signals from the first memory with the current oscillation waveform of the reference master coil stored in the second memory and, an indicator connected to receive and display the compared signals from the CPU.

* * * * *